United States Patent
Ishizuka et al.

(10) Patent No.: US 9,842,763 B2
(45) Date of Patent: Dec. 12, 2017

(54) METHOD FOR MANUFACTURING BONDED WAFER

(71) Applicant: SHIN-ETSU HANDOTAI CO., LTD., Tokyo (JP)

(72) Inventors: Toru Ishizuka, Takasaki (JP); Yuta Tamba, Nishigo-mura (JP); Eiichi Yamazaki, Shirakawa (JP)

(73) Assignee: SHIN-ETSU HANDOTAI CO., LTD., Tokyo (JP)

(*) Notice: Subject to any disclaimer, the term of this patent is extended or adjusted under 35 U.S.C. 154(b) by 0 days.

(21) Appl. No.: 15/509,961

(22) PCT Filed: Aug. 28, 2015

(86) PCT No.: PCT/JP2015/004351
§ 371 (c)(1),
(2) Date: Mar. 9, 2017

(87) PCT Pub. No.: WO2016/047046
PCT Pub. Date: Mar. 31, 2016

(65) Prior Publication Data
US 2017/0301582 A1 Oct. 19, 2017

(30) Foreign Application Priority Data
Sep. 26, 2014 (JP) .................. 2014-196627

(51) Int. Cl.
*H01L 21/30* (2006.01)
*H01L 21/46* (2006.01)
(Continued)

(52) U.S. Cl.
CPC .. *H01L 21/76254* (2013.01); *H01L 21/02639* (2013.01); *H01L 21/26506* (2013.01)

(58) Field of Classification Search
CPC ......... H01L 21/76254; H01L 21/26506; H01L 21/02639
(Continued)

(56) References Cited

U.S. PATENT DOCUMENTS 5,374,564 A 12/1994 Bruel
2003/0008478 A1 1/2003 Abe et al.
(Continued)

FOREIGN PATENT DOCUMENTS

JP    H05-211128 A    8/1993
JP    2001-345435 A   12/2001
(Continued)

OTHER PUBLICATIONS

Feb. 14, 2017 Office Action issued in Japanese Patent Application No. 2014-196627.
(Continued)

*Primary Examiner* — David S Blum
(74) *Attorney, Agent, or Firm* — Oliff PLC

(57) ABSTRACT

A method for manufacturing a bonded wafer using a base wafer which is an epitaxial wafer produced by a method including at least one of: (1) setting a chamfer width of a wafer for epitaxial growth to be 0.20 mm or less on an epitaxial growth side; (2) preparing a wafer for epitaxial growth having a rise shape on an epitaxial growth side periphery, thereby adjusting the wafer to have an amount of sag within a range of −30 nm/mm$^2$ to +10 nm/mm$^2$ on a bonding surface side periphery; and (3) adjusting epitaxial growth conditions so a change in amount of sag before and after growth becomes a positive value, thereby adjusting the wafer to have sag within a range of −30 nm/mm$^2$ to +10 nm/mm$^2$. The method can manufacture a bonded wafer with a small terrace width even when an epitaxial wafer is used as the base wafer.

16 Claims, 3 Drawing Sheets

(51) Int. Cl.
  *H01L 21/762* (2006.01)
  *H01L 21/265* (2006.01)
  *H01L 21/02* (2006.01)
(58) Field of Classification Search
  USPC .......................................................... 438/458
  See application file for complete search history.

(56) References Cited

U.S. PATENT DOCUMENTS

| | | | |
|---|---|---|---|
| 2007/0069335 A1* | 3/2007 | Endo | H01L 21/76254 |
| | | | 257/618 |
| 2009/0042364 A1* | 2/2009 | Yagi | H01L 21/76254 |
| | | | 438/459 |
| 2015/0184314 A1* | 7/2015 | Narahara | C30B 29/06 |
| | | | 428/157 |
| 2017/0200715 A1* | 7/2017 | Sekar | H01L 27/0688 |

FOREIGN PATENT DOCUMENTS

| | | |
|---|---|---|
| JP | 2005-032882 A | 2/2005 |
| JP | 2008-277477 A | 11/2008 |
| WO | 2005/027204 A1 | 3/2005 |
| WO | 2014/024404 A1 | 2/2014 |

OTHER PUBLICATIONS

Nov. 17, 2015 International Search Report issued in International Patent Application No. PCT/JP2015/004351.
Mar. 28, 2017 International Preliminary Report on Patentability issued in International Patent Application No. PCT/JP2015/004351.

* cited by examiner (a)

(b)

$$ZDD(R) \equiv \frac{\partial^2 \overline{Z}(R)}{\partial R^2} = \frac{\frac{c-b}{d} - \frac{b-a}{d}}{d} = \frac{c + a - 2b}{d^2}$$

METHOD FOR MANUFACTURING BONDED WAFER

TECHNICAL FIELD

The present invention relates to a method for manufacturing a bonded wafer by an ion-implantation delamination method, and particularly to a method for manufacturing an SOI wafer in which a silicon single crystal wafer being implanted with a hydrogen ion is bonded with a base wafer as a support wafer through an oxide film and is then delaminated.

BACKGROUND ART

As a method for manufacturing an SOI wafer, especially for manufacturing a thin-film SOI wafer that can improve the performance of an advanced integrated circuit, a method for delaminating an ion-implanted wafer after bonding to manufacture an SOI wafer (an ion-implantation delamination method: technology that is also called the Smart Cut method (a registered trademark)) has been received attention. This ion-implantation delamination method is technology that forms an oxide film on at least one of two silicon wafers, implants gas ions such as hydrogen ions or rare gas ions from an upper surface of one silicon wafer (a bond wafer), forms a micro bubble layer (a sealed layer) in the interior of the wafer, then adhering the surface from which the ions are implanted to the other silicon wafer (a base wafer) through the oxide film, subsequently performs a heat treatment (a delamination heat treatment) to delaminate the one wafer (the bond wafer) into a thin film-form by making the micro bubble layer be a cleaved surface, and further performs a heat treatment (a bonding heat treatment) to strengthen the bonding, thereby manufacturing an SOI wafer (see Patent Document 1). In this stage, the cleaved surface (a delaminated surface) becomes a surface of an SOI layer, and an SOI wafer having a thin SOI film with high thickness uniformity can be obtained relatively easily.

In this case, the peripheral portion of the SOI wafer contains a portion that cannot be bonded, and this portion is generally called a terrace. When this terrace width is large, the periphery removing region of an SOI wafer have to be set to wider than in the usual mirror polished wafer (PW). On the other hand, when the terrace width is small, even the periphery can be used for forming a device, and the effective area of a wafer can be enlarged. Accordingly, an SOI wafer with small terrace width is desirable. The terrace width is mainly determined by a roll-off shape of a wafer, that is, a sag shape on the periphery. When the sag becomes larger, the portion that cannot be bonded is widened (i.e., the terrace width is enlarged).

Patent Document 2 discloses a method for reducing the chamfer width on the a bonding surface side of both wafers in order to obtain an SOI wafer having an SOI layer which contain no or reduced periphery removing region (terrace portion) by using an ion-implantation delamination method. Patent Document 3 discloses a method for bonding in which the chamfer width is set to 100 µm or less in order to reduce the non-bonded portion of the periphery of a semiconductor bonded wafer to make the terrace portion thereof extremely small.

CITATION LIST

Patent Literature

Patent Document 1: Japanese Unexamined Patent publication (Kokai) No. H05-211128
Patent Document 2: Japanese Unexamined Patent publication (Kokai) No. 2001-345435
Patent Document 3: Japanese Unexamined Patent publication (Kokai) No. 2005-032882

SUMMARY OF INVENTION

Problem to be Solved by the Invention

Previously, the base wafer of an SOI wafer was a substrate for supporting an SOI layer as a support substrate. Recently, however, there has been an increase of examples in which even a foundation of a BOX layer, separated by a trench and so on, is used as a part of a device structure. For forming such a region used as a part of a device structure, the SOI wafer is becoming to be manufactured by a method in which a wafer having an epitaxial layer formed thereon (an epitaxial wafer), with the dopant being controlled, is produced and used as a base wafer. The epitaxial layer, however, have to be controlled its resistivity and a conductivity type on the basis of the requirement of a device, and this limitation restricts the conditions of epitaxial growth. Accordingly, the roll-off shape of an epitaxial wafer is not necessarily given priority. Therefore, when an epitaxial wafer is used as a base wafer, a terrace width of the SOI wafer has become large, and an effective area of the SOI wafer has become small. Such a problem also arises when a bond wafer and a base wafer are bonded directly without intervening an insulating film not only when they are bonded through an insulating film to manufacture an SOI wafer.

The present invention was accomplished to solve the above-described problems. It is an object of the present invention to provide a method for manufacturing a bonded wafer which can manufacture a bonded wafer with a small terrace width even when an epitaxial wafer is used as the base wafer.

Means for Solving Problem

To solve the problems, the present invention provides a method for manufacturing a bonded wafer having a thin-film on a base wafer, comprising: ion-implanting at least one gas ion selected from a hydrogen ion and a rare gas ion from a surface of a bond wafer, thereby forming an ion-implanted layer into the inside of the bond wafer; bonding the ion-implanted surface of the bond wafer and a surface of the base wafer directly or through an insulating film; and then delaminating the bond wafer along the ion-implanted layer; wherein the base wafer is an epitaxial wafer produced by a method including at least one of the following conditions (1) to (3):

(1) setting a chamfer width of a wafer for epitaxial growth to be 0.20 mm or less on an epitaxial growth side;

(2) preparing a wafer for epitaxial growth having a periphery shape adjusted to a rise shape on an epitaxial growth side, thereby adjusting the epitaxial wafer to have an amount of sag within a range of −30 nm/mm$^2$ to +10 nm/mm$^2$ on a periphery of a bonding surface side; and (3) adjusting epitaxial growth conditions such that a change of an amount of sag before and after the epitaxial growth becomes a positive value, thereby adjusting the epitaxial wafer to have an amount of sag within a range of −30 nm/mm$^2$ to +10 nm/mm$^2$ on a periphery of a bonding surface side.

Such a method for manufacturing a bonded wafer can manufacture a bonded wafer with a small terrace width even when an epitaxial wafer is used as the base wafer.

It is preferable that the foregoing chamfer width in (1) be set to 0.05 mm or more.

This makes it possible to prevent a crack and chipping during the processing.

It is preferable that the bond wafer be a wafer adjusted to have an amount of sag within a range of −30 nm/mm² to +10 nm/mm² on a periphery of a bonding surface side.

The use of such a bond wafer makes it easy to coordinate with the periphery shape of a base wafer, which is an epitaxial wafer, thereby making it possible to produce a bonded wafer with a small terrace width more easily.

It is also preferable that the bonded wafer be manufactured to have a terrace width of 1 mm or less.

Such a bonded wafer has a large effective area, and even its periphery can be used for forming a device.

The foregoing amount of sag can be a value in ZDD (Z-Height Double Differentiation) expressed by second order differential of a displacement of a surface of the wafer with respect to a radius of the wafer.

Effect of Invention

As described above, the inventive method for manufacturing a bonded wafer can manufacture a bonded wafer with a small terrace width (e.g., 1 mm or less) even when an epitaxial wafer is used as the base wafer. Such a bonded wafer has a large effective area, and even its periphery can be used for forming a device.

DESCRIPTION OF EMBODIMENTS

As described above, it has been desired to develop a method for manufacturing a bonded wafer which can manufacture a bonded wafer with a small terrace width even when an epitaxial wafer is used as the base wafer.

The inventors have diligently investigated on the foregoing problem and found that the bonded wafer with a small terrace width can be manufactured by using an epitaxial wafer produced by a method including at least one of the following conditions (1) to (3) as the base wafer; thereby brought the present invention to completion.

That is, the present invention is a method for manufacturing a bonded wafer having a thin-film on a base wafer, comprising: ion-implanting at least one gas ion selected from a hydrogen ion and a rare gas ion from a surface of a bond wafer, thereby forming an ion-implanted layer into the inside of the bond wafer; bonding the ion-implanted surface of the bond wafer and a surface of the base wafer directly or through an insulating film; and then delaminating the bond wafer along the ion-implanted layer; wherein the base wafer is an epitaxial wafer produced by a method including at least one of the following conditions (1) to (3):

(1) setting a chamfer width of a wafer for epitaxial growth to be 0.20 mm or less on an epitaxial growth side;

(2) preparing a wafer for epitaxial growth having a periphery shape adjusted to a rise shape on an epitaxial growth side, thereby adjusting the epitaxial wafer to have an amount of sag within a range of −30 nm/mm² to +10 nm/mm² on a periphery of a bonding surface side; and (3) adjusting epitaxial growth conditions such that a change of an amount of sag before and after the epitaxial growth becomes a positive value, thereby adjusting the epitaxial wafer to have an amount of sag within a range of −30 nm/mm² to +10 nm/mm² on a periphery of a bonding surface side.

Hereinafter, the present invention will be described specifically, but the present invention is not limited thereto.

Figure 5:
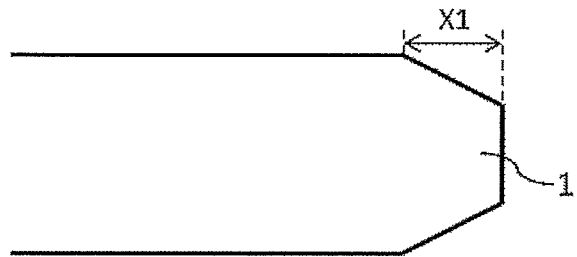
FIG. 5 are explanatory diagrams to explain (a) the chamfer width and (b) the terrace width.
Figure 5:
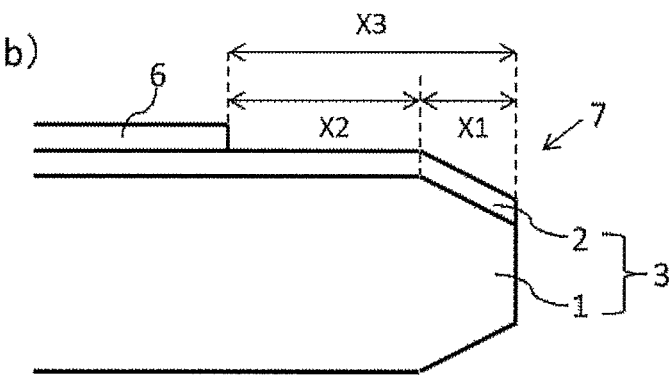

Herein, the chamfer width and the terrace width will be described with reference to FIG. 5.

The chamfer width of a wafer 1 for epitaxial growth on the epitaxial growth side is expressed by the length of X1 in FIG. 5(a).

The terrace width is the length expressed by X3 in FIG. 5(b), and is expressed by the sum of the chamfer width X1 and the width X2 from the end of the chamfer portion to the end of the thin film (SOI layer) 6 in the bonded wafer 7 having the thin film (SOI layer) 6 formed on the base wafer 3.

In the present invention, the amount of sag can be ZDD (Z-Height Double Differentiation), which is a commonly used indication.

Figure 6:
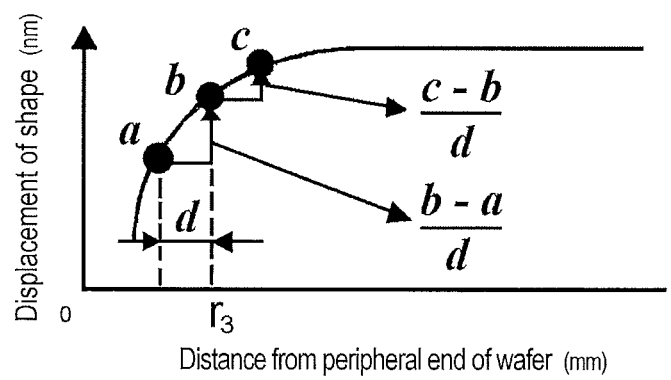
FIG. 6 is an explanatory diagram to explain the ZDD.

Definition of ZDD will now be described with reference to FIG. 6. An abscissa in FIG. 6 represents a distance from a peripheral end of a wafer, and an ordinate in the same represents a displacement of a shape of a wafer surface. In general, ZDD means second order differential of a displacement of a surface of the wafer with respect to a radius of the wafer. A positive value of ZDD represents that a surface is displaced in a rising direction, whereas a negative value of the same represents that the surface is displaced in a sagging direction.

Figure 1:
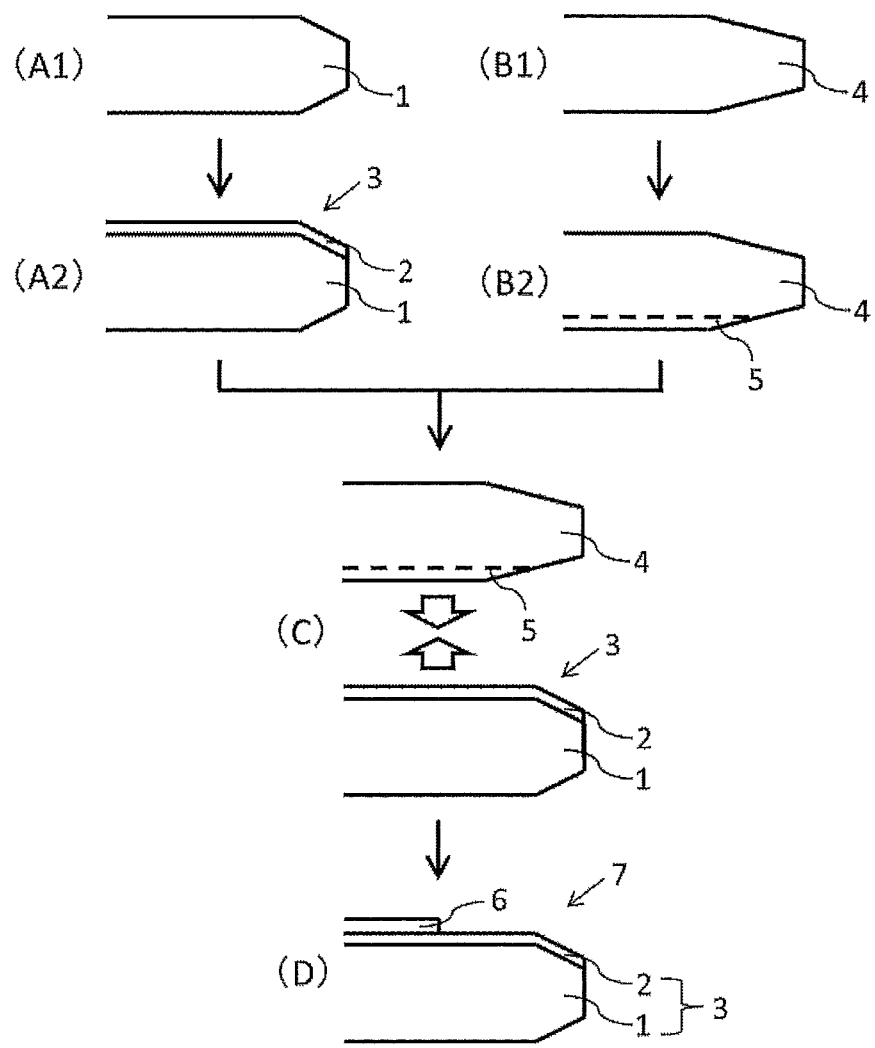
FIG. 1 is a flowchart showing an example of the method for manufacturing a bonded wafer of the present invention.

Hereinafter, the inventive method for manufacturing a bonded wafer will be described with reference to FIG. 1. FIG. 1 is a flowchart showing an example of the method for manufacturing a bonded wafer of the present invention.

In the method for manufacturing a bonded wafer of FIG. 1, to provide an epitaxial wafer to be a base wafer, a wafer 1 for epitaxial growth is prepared (FIG. 1 (A1)), and onto the prepared wafer 1 for epitaxial growth, an epitaxial layer 2 is formed to produce an epitaxial wafer 3 (FIG. 1 (A2)). In this case, the epitaxial wafer is produced by a method including at least one of the foregoing conditions (1) to (3). Thus produced epitaxial wafer 3 is used as the base wafer (hereinafter, referred to as a base wafer 3).

Then, a bond wafer 4 is prepared (FIG. 1 (B1)), and the bond wafer 4 is subjected to ion-implanting of at least one gas ion selected from a hydrogen ion and a rare gas ion to form an ion-implanted layer 5 into the inside of the bond wafer (FIG. 1 (B2)).

Subsequently, the ion-implanted surface of the bond wafer 4 and the surface of the base wafer 3 are bonded (FIG. 1 (C)). Then, the bond wafer 4 is delaminated along the ion-implanted layer 5 to form a thin film 6 on the base wafer 3, thereby producing a bonded wafer 7 (FIG. 1 (D)).

Hereinafter, each step will be described more specifically.

[Preparation of Base Wafer (Produce of Epitaxial Wafer)]

In the present invention, the base wafer is an epitaxial wafer produced by a method including at least one of the following conditions (1) to (3):

(1) setting a chamfer width of a wafer for epitaxial growth to be 0.20 mm or less on the epitaxial growth side;

(2) preparing a wafer for epitaxial growth having a periphery shape adjusted to a rise shape on the epitaxial growth side, thereby adjusting the epitaxial wafer to have an amount of sag within a range of −30 nm/mm$^2$ to +10 nm/mm$^2$ on the periphery of the bonding surface side; and (3) adjusting epitaxial growth conditions such that a change of an amount of sag before and after the epitaxial growth becomes a positive value, thereby adjusting the epitaxial wafer to have an amount of sag within a range of −30 nm/mm$^2$ to +10 nm/mm$^2$ on the periphery of the bonding surface side.

It is to be noted that the wafer that is performed epitaxial growth is not particularly limited. It is suitable, however, to use a mirror-polished silicon single crystal wafer, etc.

Hereinafter, each of the conditions (1) to (3) will be described more specifically.

<Condition (1)>

Figure 2:
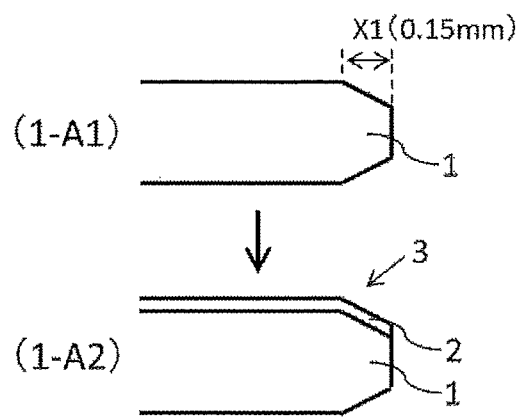
FIG. 2 is a cross-sectional view showing an example for producing an epitaxial wafer by a method including the condition (1)

FIG. 2 is a cross-sectional view showing an example for producing an epitaxial wafer by a method including the condition (1). In the method of FIG. 2, first, a wafer with the chamfer width X1 of 0.15 mm (0.20 mm or less) on the side that is performed epitaxial growth is prepared as the wafer 1 for epitaxial growth (FIG. 2 (1-A1)). Then, onto the surface of this wafer 1 for epitaxial growth, an epitaxial layer 2 is formed to produce an epitaxial wafer 3 (FIG. 2 (1-A2)).

By using a wafer with the chamfer width X1 of 0.20 mm or less on the epitaxial growth side as the wafer 1 for epitaxial growth, the terrace width can be reduced remarkably in manufacturing a bonded wafer.

In this case, the chamfer width X1 of 0.05 mm or more makes it possible to prevent a crack and chipping during the processing, and is preferable.

<Condition (2)>

Figure 3:
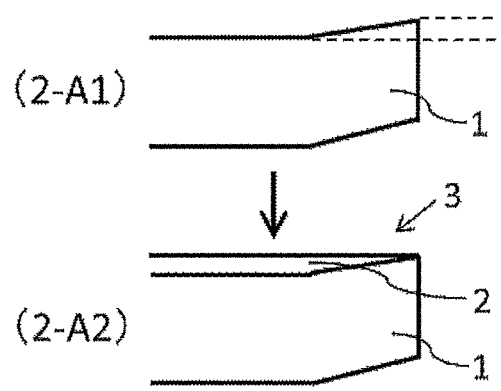
FIG. 3 is a cross-sectional view showing an example for producing an epitaxial wafer by a method including the condition (2)

FIG. 3 is a cross-sectional view showing an example for producing an epitaxial wafer by a method including the condition (2). In the method of FIG. 3, first, a wafer having a periphery shape adjusted to a rise shape on the side that is performed epitaxial growth is prepared as the wafer 1 for epitaxial growth (FIG. 3 (2-A1)). Then, onto the surface of this wafer 1 for epitaxial growth, an epitaxial layer 2 is formed to produce an epitaxial wafer 3 while adjusting an amount of sag of the epitaxial wafer 3 on the periphery of the bonding surface side to be within a range of −30 nm/mm$^2$ to +10 nm/mm$^2$ (FIG. 3 (2-A2)).

It is to be noted that the adjustment of the periphery shape to the rise shape on the epitaxial growth side of the wafer 1 for epitaxial growth can be carried out by appropriately adjusting the polishing conditions such as a load and a rotation speed of a polishing cloth in mirror-polishing.

<Condition (3)>

Figure 4:
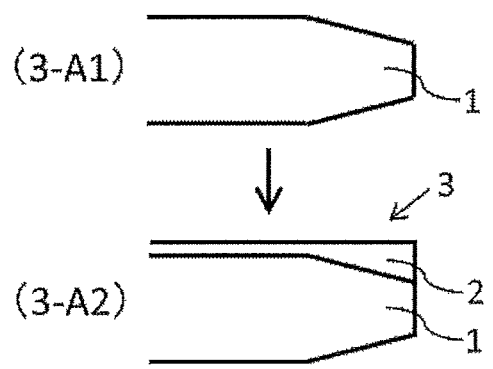
FIG. 4 is a cross-sectional view showing an example for producing an epitaxial wafer by a method including the condition (3)

FIG. 4 is a cross-sectional view showing an example for producing an epitaxial wafer by a method including the condition (3). In the method of FIG. 4, a wafer 1 for epitaxial growth is prepared (FIG. 4 (3-A1)). Then, onto the surface of this wafer 1 for epitaxial growth, an epitaxial layer 2 is formed to produce an epitaxial wafer 3 while adjusting the epitaxial growth conditions such that a change of an amount of sag before and after the epitaxial growth becomes a positive value, and an amount of sag of the epitaxial wafer 3 on the periphery of the bonding surface side falls within a range of −30 nm/mm$^2$ to +10 nm/mm$^2$ (FIG. 4 (3-A2)).

It is to be noted that the adjustment in such a way that a change of an amount of sag before and after the epitaxial growth becomes a positive value means that when the wafer has a sag shape before the epitaxial growth, it is adjusted to reduce the sag shape or to have a flat or rise shape after the epitaxial growth; when the wafer is flat before the epitaxial growth, it is adjusted to have a rise shape after the epitaxial growth; and when the wafer has a rise shape before the epitaxial growth, it is adjusted to enlarge the rise shape after the epitaxial growth.

It is possible to selectively produce the epitaxial layer in a rise shape or a sag shape by appropriately adjusting the growth conditions in the epitaxial growth (growth rate, growth temperature, power balance of a heating lump, etc.).

In condition (2) and condition (3), the chamfer width of the wafer 1 for epitaxial growth on the epitaxial growth side is not particularly limited, and can be an ordinary width (about 0.30 to 0.50 mm).

In the inventive method for manufacturing a bonded wafer, an epitaxial wafer is produced by a method including at least one of the foregoing conditions (1) to (3) described above. That is, an epitaxial wafer may be produced by a method including one of the conditions (1) to (3) as described above, or may be produced by a method including two of or all three of these conditions.

As a method including the two conditions, the following three methods are enumerated.

(Conditions (1)+(2))

A method in which a wafer having a chamfer width of 0.20 mm or less on the epitaxial growth side and a periphery shape adjusted to a rise shape on the epitaxial growth side is prepared as a wafer for epitaxial growth, and an epitaxial layer is formed on the surface of the wafer while adjusting an amount of sag of the epitaxial wafer on the periphery of the bonding surface side to be within a range of −30 nm/mm$^2$ to +10 nm/mm$^2$.

(Conditions (1)+(3))

A method in which a wafer having a chamfer width of 0.20 mm or less on the epitaxial growth side is prepared as a wafer for epitaxial growth, and an epitaxial layer is formed on the surface of the wafer while adjusting the epitaxial growth conditions such that a change of an amount of sag before and after the epitaxial growth becomes a positive value, and an amount of sag of the epitaxial wafer on the periphery of the bonding surface side falls within a range of −30 nm/mm$^2$ to +10 nm/mm$^2$.

(Conditions (2)+(3))

A method in which a wafer having a periphery shape adjusted to a rise shape on the epitaxial growth side is prepared as a wafer for epitaxial growth, and an epitaxial layer is formed on the surface of the wafer while adjusting the epitaxial growth conditions such that a change of an amount of sag before and after the epitaxial growth becomes a positive value, and an amount of sag of the epitaxial wafer on the periphery of the bonding surface side falls within a range of −30 nm/mm$^2$ to +10 nm/mm$^2$.

As a method including all of the three conditions, the following method is enumerated.

(Conditions (1)+(2)+(3))

A method in which a wafer having a chamfer width of 0.20 mm or less on the epitaxial growth side and a periphery shape adjusted to a rise shape on the epitaxial growth side is prepared as a wafer for epitaxial growth, and an epitaxial layer is formed on the surface of the wafer while adjusting the epitaxial growth conditions such that a change of an amount of sag before and after the epitaxial growth becomes a positive value, and an amount of sag of the epitaxial wafer on the periphery of the bonding surface side falls within a range of −30 nm/mm² to +10 nm/mm².

It is to be noted that when including still more conditions, the terrace width of a produced bonded wafer can be smaller. Accordingly, it is preferable to include two of the conditions (1) to (3), and is more preferable to include all of the three conditions.

An epitaxial wafer used as a base water can be manufactured by a method described above.

[Preparation of Bond Wafer]

As a bond wafer used in the present invention, which is not particularly limited, a mirror-polished silicon single crystal wafer can be suitably used, for example. Incidentally, although the chamfer width of the bond wafer on the bonding surface side may be an ordinary width (about 0.30 to 0.50 mm), it is preferable that the bond wafer be adjusted to have an amount of sag within a range of −30 nm/mm² to +10 nm/mm² on the periphery of the bonding surface side. The use of such a bond wafer makes it easy to coordinate with the periphery shape of the base wafer, which is an epitaxial wafer, thereby improving the effect of reducing a chamfer width, and makes it possible to produce a bonded wafer with a small terrace width more easily.

The bond wafer may have an oxide film formed thereon to be a buried oxide film.

Then, at least one gas ion selected from a hydrogen ion and a rare gas ion is ion-implanted from above the surface of a bond wafer or an oxide film with an ion implanter to form an ion-implanted layer into the inside of the wafer. An accelerating voltage of the ion implantation (acceleration energy) can be selected such that a thin film having a target thickness can be obtained.

[Bonding]

Subsequently, the base wafer (an epitaxial wafer) prepared as described above and the bond wafer having an ion-implanted layer formed therein are bonded. The ion-implanted surface of the bond wafer and the surface of the base wafer is bonded directly or through an insulating film.

[Formation of Thin Film (Delamination of Bond Wafer)]

Then, in the wafers thus bonded, the bond wafer is delaminated along the ion-implanted layer to form a thin film on the base wafer. The delamination can be performed by a known method such as a delamination heat treatment.

The inventive method for manufacturing a bonded wafer described above can manufacture a bonded wafer with a small terrace width (e.g., 1 mm or less, more preferably 0.5 mm or less) even when an epitaxial wafer is used as the base wafer. Such a bonded wafer has a large effective area, and even its periphery can be used for forming a device.

EXAMPLE

The present invention will be specifically described below with reference to Examples and Comparative Example, but the present invention is not limited thereto.

Example 1

As a wafer for epitaxial growth, a PW wafer (a mirror-polished wafer composed of silicon single crystal) with a diameter of 300 mm having a chamfer shape with a chamfer width of 0.20 mm was prepared. The amount of sag of this wafer at this time was set to −20 nm/mm² (a sag shape) in a value measured as an amount of inclination (ZDD) at a point of 148 mm from the center (a point of 2 mm from the peripheral end). Then, onto this wafer, an epitaxial layer with a thickness of 3.5 μm was formed. The epitaxial growth conditions were adjusted to make the amount of sag after the epitaxial growth be −60 nm/mm². Thus prepared epitaxial wafer was used as a base wafer.

For a bond wafer, a PW wafer with a diameter of 300 mm having a chamfer shape with a chamfer width of 0.35 mm and an amount of sag on the periphery of the bonding surface side of −20 nm/mm² was prepared. To this PW wafer, a BOX oxide film with a film thickness of 200 nm was formed. This was then subjected to hydrogen ion-implantation on conditions of acceleration energy of 50 keV and a dose amount of $5.0 \times 10^{16}$/cm². Thus prepared wafer was used as a bond wafer.

Subsequently, the bond wafer and the base wafer were bonded, and subjected to a delamination heat treatment at 500° C. for 30 minutes. As a result, the bond wafer was delaminated, and an SOI wafer could be obtained. In the produced SOI wafer, the chamfer width was 0.20 mm, the width from the end of the chamfer portion to the end of the SOI layer was 0.80 mm, and the sum of these (the terrace width) was 1.00 mm.

The chamfer widths and the amounts of sag of the base wafer and the bond wafer are shown in Table 1. Table 2 shows the chamfer width, the width from the end of the chamfer portion to the end of the SOI layer, and the terrace width of the produced SOI wafer.

Example 2

As a wafer for epitaxial growth, a PW wafer (a mirror-polished wafer composed of silicon single crystal) with a diameter of 300 mm having a chamfer shape with a chamfer width of 0.35 mm was prepared. The amount of sag of this wafer at this time was set to +20 nm/mm² (a rise shape) in a value measured as an amount of inclination (ZDD) at a point of 148 mm from the center (a point of 2 mm from the peripheral end). Then, onto this wafer, an epitaxial layer with a thickness of 3.5 μm was formed. The epitaxial growth conditions were adjusted to make the amount of sag after the epitaxial growth be −30 nm/mm². Thus prepared epitaxial wafer was used as a base wafer.

For a bond wafer, a PW wafer with a diameter of 300 mm having a chamfer shape with a chamfer width of 0.35 mm and an amount of sag on the periphery of the bonding surface side of −20 nm/mm² was prepared. To this PW wafer, a BOX oxide film with a film thickness of 200 nm was formed. This was then subjected to hydrogen ion-implantation on conditions of acceleration energy of 50 keV and a dose amount of $5.0 \times 10^{16}$/cm². Thus prepared wafer was used as a bond wafer.

Subsequently, the bond wafer and the base wafer were bonded, and subjected to a delamination heat treatment at 500° C. for 30 minutes. As a result, the bond wafer was delaminated, and an SOI wafer could be obtained. In the produced SOI wafer, the chamfer width was 0.35 mm, the width from the end of the chamfer portion to the end of the SOI layer was 0.65 mm, and the sum of these (the terrace width) was 1.00 mm.

The chamfer widths and the amounts of sag of the base wafer and the bond wafer are shown in Table 1. Table 2 shows the chamfer width, the width from the end of the chamfer portion to the end of the SOI layer, and the terrace width of the produced SOI wafer.

Example 3

As a wafer for epitaxial growth, a PW wafer (a mirror-polished wafer composed of silicon single crystal) with a diameter of 300 mm having a chamfer shape with a chamfer width of 0.35 mm was prepared. The amount of sag of this wafer at this time was set to −40 nm/mm$^2$ (a sag shape) in a value measured as an amount of inclination (ZDD) at a point of 148 mm from the center (a point of 2 mm from the peripheral end). Then, onto this wafer, an epitaxial layer with a thickness of 3.5 μm was formed. The epitaxial growth conditions were adjusted to make the amount of sag after the epitaxial growth be −30 nm/mm$^2$. Thus prepared epitaxial wafer was used as a base wafer.

For a bond wafer, a PW wafer with a diameter of 300 mm having a chamfer shape with a chamfer width of 0.35 mm and an amount of sag on the periphery of the bonding surface side of −20 nm/mm$^2$ was prepared. To this PW wafer, a BOX oxide film with a film thickness of 200 nm was formed. This was then subjected to hydrogen ion-implantation on conditions of acceleration energy of 50 keV and a dose amount of $5.0 \times 10^{16}$/cm$^2$. Thus prepared wafer was used as a bond wafer.

Subsequently, the bond wafer and the base wafer were bonded, and subjected to a delamination heat treatment at 500° C. for 30 minutes. As a result, the bond wafer was delaminated, and an SOI wafer could be obtained. In the produced SOI wafer, the chamfer width was 0.35 mm, the width from the end of the chamfer portion to the end of the SOI layer was 0.60 mm, and the sum of these (the terrace width) was 0.95 mm.

The chamfer widths and the amounts of sag of the base wafer and the bond wafer are shown in Table 1. Table 2 shows the chamfer width, the width from the end of the chamfer portion to the end of the SOI layer, and the terrace width of the produced SOI wafer.

Example 4

As a wafer for epitaxial growth, a PW wafer (a mirror-polished wafer composed of silicon single crystal) with a diameter of 300 mm having a chamfer shape with a chamfer width of 0.15 mm was prepared. The amount of sag of this wafer at this time was set to +20 nm/mm$^2$ (a rise shape) in a value measured as an amount of inclination (ZDD) at a point of 148 mm from the center (a point of 2 mm from the peripheral end). Then, onto this wafer, an epitaxial layer with a thickness of 3.5 μm was formed. The epitaxial growth conditions were adjusted to make the amount of sag after the epitaxial growth be −20 nm/mm$^2$. Thus prepared epitaxial wafer was used as a base wafer.

For a bond wafer, a PW wafer with a diameter of 300 mm having a chamfer shape with a chamfer width of 0.35 mm and an amount of sag on the periphery of the bonding surface side of −20 nm/mm$^2$ was prepared. To this PW wafer, a BOX oxide film with a film thickness of 200 nm was formed. This was then subjected to hydrogen ion-implantation on conditions of acceleration energy of 50 keV and a dose amount of $5.0 \times 10^{16}$/cm$^2$. Thus prepared wafer was used as a bond wafer.

Subsequently, the bond wafer and the base wafer were bonded, and subjected to a delamination heat treatment at 500° C. for 30 minutes. As a result, the bond wafer was delaminated, and an SOI wafer could be obtained. In the produced SOI wafer, the chamfer width was 0.15 mm, the width from the end of the chamfer portion to the end of the SOI layer was 0.65 mm, and the sum of these (the terrace width) was 0.80 mm.

The chamfer widths and the amounts of sag of the base wafer and the bond wafer are shown in Table 1. Table 2 shows the chamfer width, the width from the end of the chamfer portion to the end of the SOI layer, and the terrace width of the produced SOI wafer.

Example 5

As a wafer for epitaxial growth, a PW wafer (a mirror-polished wafer composed of silicon single crystal) with a diameter of 300 mm having a chamfer shape with a chamfer width of 0.15 mm was prepared. The amount of sag of this wafer at this time was set to −20 nm/mm$^2$ (a sag shape) in a value measured as an amount of inclination (ZDD) at a point of 148 mm from the center (a point of 2 mm from the peripheral end). Then, onto this wafer, an epitaxial layer with a thickness of 3.5 μm was formed. The epitaxial growth conditions were adjusted to make the amount of sag after the epitaxial growth be −10 nm/mm$^2$. Thus prepared epitaxial wafer was used as a base wafer.

For a bond wafer, a PW wafer with a diameter of 300 mm having a chamfer shape with a chamfer width of 0.35 mm and an amount of sag on the periphery of the bonding surface side of −20 nm/mm$^2$ was prepared. To this PW wafer, a BOX oxide film with a film thickness of 200 nm was formed. This was then subjected to hydrogen ion-implantation on conditions of acceleration energy of 50 keV and a dose amount of $5.0 \times 10^{16}$/cm$^2$. Thus prepared wafer was used as a bond wafer.

Subsequently, the bond wafer and the base wafer were bonded, and subjected to a delamination heat treatment at 500° C. for 30 minutes. As a result, the bond wafer was delaminated, and an SOI wafer could be obtained. In the produced SOI wafer, the chamfer width was 0.15 mm, the width from the end of the chamfer portion to the end of the SOI layer was 0.60 mm, and the sum of these (the terrace width) was 0.75 mm.

The chamfer widths and the amounts of sag of the base wafer and the bond wafer are shown in Table 1. Table 2 shows the chamfer width, the width from the end of the chamfer portion to the end of the SOI layer, and the terrace width of the produced SOI wafer.

Example 6

As a wafer for epitaxial growth, a PW wafer (a mirror-polished wafer composed of silicon single crystal) with a diameter of 300 mm having a chamfer shape with a chamfer width of 0.35 mm was prepared. The amount of sag of this wafer at this time was set to +5 nm/mm$^2$ (a rise shape) in a value measured as an amount of inclination (ZDD) at a point of 148 mm from the center (a point of 2 mm from the peripheral end). Then, onto this wafer, an epitaxial layer with a thickness of 3.5 μm was formed. The epitaxial growth conditions were adjusted to make the amount of sag after the epitaxial growth be +10 nm/mm$^2$. Thus prepared epitaxial wafer was used as a base wafer.

For a bond wafer, a PW wafer with a diameter of 300 mm having a chamfer shape with a chamfer width of 0.35 mm and an amount of sag on the periphery of the bonding surface side of −20 nm/mm$^2$ was prepared. To this PW wafer, a BOX oxide film with a film thickness of 200 nm was formed. This was then subjected to hydrogen ion-implantation on conditions of acceleration energy of 50 keV and a dose amount of $5.0 \times 10^{16}$/cm$^2$. Thus prepared wafer was used as a bond wafer.

Subsequently, the bond wafer and the base wafer were bonded, and subjected to a delamination heat treatment at 500° C. for 30 minutes. As a result, the bond wafer was delaminated, and an SOI wafer could be obtained. In the produced SOI wafer, the chamfer width was 0.35 mm, the width from the end of the chamfer portion to the end of the SOI layer was 0.25 mm, and the sum of these (the terrace width) was 0.60 mm.

The chamfer widths and the amounts of sag of the base wafer and the bond wafer are shown in Table 1. Table 2 shows the chamfer width, the width from the end of the chamfer portion to the end of the SOI layer, and the terrace width of the produced SOI wafer.

Example 7

As a wafer for epitaxial growth, a PW wafer (a mirror-polished wafer composed of silicon single crystal) with a diameter of 300 mm having a chamfer shape with a chamfer width of 0.15 mm was prepared. The amount of sag of this wafer at this time was set to +5 nm/mm$^2$ (a rise shape) in a value measured as an amount of inclination (ZDD) at a point of 148 mm from the center (a point of 2 mm from the peripheral end). Then, onto this wafer, an epitaxial layer with a thickness of 3.5 μm was formed. The epitaxial growth conditions were adjusted to make the amount of sag after the epitaxial growth be +10 nm/mm$^2$. Thus prepared epitaxial wafer was used as a base wafer.

For a bond wafer, a PW wafer with a diameter of 300 mm having a chamfer shape with a chamfer width of 0.35 mm and an amount of sag on the periphery of the bonding surface side of −20 nm/mm$^2$ was prepared. To this PW wafer, a BOX oxide film with a film thickness of 200 nm was formed. This was then subjected to hydrogen ion-implantation on conditions of acceleration energy of 50 keV and a dose amount of 5.0×10$^{16}$/cm$^2$. Thus prepared wafer was used as a bond wafer.

Subsequently, the bond wafer and the base wafer were bonded, and subjected to a delamination heat treatment at 500° C. for 30 minutes. As a result, the bond wafer was delaminated, and an SOI wafer could be obtained. In the produced SOI wafer, the chamfer width was 0.15 mm, the width from the end of the chamfer portion to the end of the SOI layer was 0.25 mm, and the sum of these (the terrace width) was 0.40 mm.

The chamfer widths and the amounts of sag of the base wafer and the bond wafer are shown in Table 1. Table 2 shows the chamfer width, the width from the end of the chamfer portion to the end of the SOI layer, and the terrace width of the produced SOI wafer.

Comparative Example 1

As a wafer for epitaxial growth, a PW wafer (a mirror-polished wafer composed of silicon single crystal) with a diameter of 300 mm having a chamfer shape with a chamfer width of 0.35 mm was prepared. The amount of sag of this wafer at this time was set to −20 nm/mm$^2$ (a sag shape) in a value measured as an amount of inclination (ZDD) at a point of 148 mm from the center (a point of 2 mm from the peripheral end). Then, onto this wafer, an epitaxial layer with a thickness of 3.5 μm was formed. The epitaxial growth conditions were adjusted to make the amount of sag after the epitaxial growth be −60 nm/mm$^2$. Thus prepared epitaxial wafer was used as a base wafer.

For a bond wafer, a PW wafer with a diameter of 300 mm having a chamfer shape with a chamfer width of 0.35 mm and an amount of sag on the periphery of the bonding surface side of −20 nm/mm$^2$ was prepared. To this PW wafer, a BOX oxide film with a film thickness of 200 nm was formed. This was then subjected to hydrogen ion-implantation on conditions of acceleration energy of 50 keV and a dose amount of 5.0×10$^{16}$/cm$^2$. Thus prepared wafer was used as a bond wafer.

Subsequently, the bond wafer and the base wafer were bonded, and subjected to a delamination heat treatment at 500° C. for 30 minutes. As a result, the bond wafer was delaminated, and an SOI wafer could be obtained. In the produced SOI wafer, the chamfer width was 0.35 mm, the width from the end of the chamfer portion to the end of the SOI layer was 0.80 mm, and the sum of these (the terrace width) was 1.15 mm.

The chamfer widths and the amounts of sag of the base wafer and the bond wafer are shown in Table 1. Table 2 shows the chamfer width, the width from the end of the chamfer portion to the end of the SOI layer, and the terrace width of the produced SOI wafer.

TABLE 1

| | Base wafer | | | Bond wafer | | |
|---|---|---|---|---|---|---|
| | Chamfer width (mm) | Amount of sag before epitaxial growth (nm/mm$^2$) | Amount of sag after epitaxial growth (nm/mm$^2$) | Chamfer width (mm) | Amount of sag (nm/mm$^2$) | Conditions of method for manufacturing epitaxial wafer |
| Example 1 | 0.20 | −20 | −60 | 0.35 | −20 | (1) |
| Example 2 | 0.35 | +20 | −30 | 0.35 | −20 | (2) |
| Example 3 | 0.35 | −40 | −30 | 0.35 | −20 | (3) |
| Example 4 | 0.15 | +20 | −20 | 0.35 | −20 | (1) + (2) |
| Example 5 | 0.15 | −20 | −10 | 0.35 | −20 | (1) + (3) |
| Example 6 | 0.35 | +5 | +10 | 0.35 | −20 | (2) + (3) |
| Example 7 | 0.15 | +5 | +10 | 0.35 | −20 | (1) + (2) + (3) |
| Comparative Example 1 | 0.35 | −20 | −60 | 0.35 | −20 | — |

TABLE 2

| | Chamfer width (mm) | Width from the end of the chamfer portion to the end of the SOI layer (mm) | Terrace width (mm) |
|---|---|---|---|
| Example 1 | 0.20 | 0.80 | 1.00 |
| Example 2 | 0.35 | 0.65 | 1.00 |
| Example 3 | 0.35 | 0.60 | 0.95 |
| Example 4 | 0.15 | 0.65 | 0.80 |
| Example 5 | 0.15 | 0.60 | 0.75 |
| Example 6 | 0.35 | 0.25 | 0.60 |
| Example 7 | 0.15 | 0.25 | 0.40 |

TABLE 2-continued

| | Chamfer width (mm) | Width from the end of the chamfer portion to the end of the SOI layer (mm) | Terrace width (mm) |
|---|---|---|---|
| Comparative Example 1 | 0.35 | 0.80 | 1.15 |

As shown in Table 2, each Examples 1 to 7, which used an epitaxial wafer manufactured by a method including at least one of the conditions (1) to (3) as a base wafer, could manufacture a bonded wafer with a terrace width of 1 mm or less. On the other hand, Comparative example 1, which used an epitaxial wafer manufactured by a method without including any of the conditions (1) to (3) as a base wafer, could not manufacture a bonded wafer with a terrace width of 1 mm or less. Moreover, the terrace width could be reduced smaller by using an epitaxial wafer produced by a method including two or more conditions of the conditions (1) to (3) as a base wafer.

From the results described above, it was revealed that the inventive method for manufacturing a bonded wafer can manufacture a bonded wafer with a small terrace width (e.g., 1 mm or less) even when an epitaxial wafer is used as a base wafer.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for manufacturing a bonded wafer having a thin-film on a base wafer, comprising: ion-implanting at least one gas ion selected from a hydrogen ion and a rare gas ion from a surface of a bond wafer, thereby forming an ion-implanted layer into the inside of the bond wafer; bonding the ion-implanted surface of the bond wafer and a surface of the base wafer directly or through an insulating film; and then delaminating the bond wafer along the ion-implanted layer; wherein
the base wafer is an epitaxial wafer produced by a method including at least one of the following conditions (1) to (3):
(1) setting a chamfer width of a wafer for epitaxial growth to be 0.20 mm or less on an epitaxial growth side;
(2) preparing a wafer for epitaxial growth having a periphery shape adjusted to a rise shape on an epitaxial growth side, thereby adjusting the epitaxial wafer to have an amount of sag within a range of $-30$ nm/mm$^2$ to $+10$ nm/mm$^2$ on a periphery of a bonding surface side; and
(3) adjusting epitaxial growth conditions such that a change of an amount of sag before and after the epitaxial growth becomes a positive value, thereby adjusting the epitaxial wafer to have an amount of sag within a range of $-30$ nm/mm$^2$ to $+10$ nm/mm$^2$ on a periphery of a bonding surface side.

2. The method for manufacturing a bonded wafer according to claim 1, wherein the chamfer width in (1) is set to 0.05 mm or more.

3. The method for manufacturing a bonded wafer according to claim 1, wherein the bond wafer is a wafer adjusted to have an amount of sag within a range of $-30$ nm/mm$^2$ to $+10$ nm/mm$^2$ on a periphery of a bonding surface side.

4. The method for manufacturing a bonded wafer according to claim 2, wherein the bond wafer is a wafer adjusted to have an amount of sag within a range of $-30$ nm/mm$^2$ to $+10$ nm/mm$^2$ on a periphery of a bonding surface side.

5. The method for manufacturing a bonded wafer according to claim 1, wherein the bonded wafer is manufactured to have a terrace width of 1 mm or less.

6. The method for manufacturing a bonded wafer according to claim 2, wherein the bonded wafer is manufactured to have a terrace width of 1 mm or less.

7. The method for manufacturing a bonded wafer according to claim 3, wherein the bonded wafer is manufactured to have a terrace width of 1 mm or less.

8. The method for manufacturing a bonded wafer according to claim 4, wherein the bonded wafer is manufactured to have a terrace width of 1 mm or less.

9. The method for manufacturing a bonded wafer according to claim 1, wherein the amount of sag is a value in ZDD expressed by second order differential of a displacement of a surface of the wafer with respect to a radius of the wafer.

10. The method for manufacturing a bonded wafer according to claim 2, wherein the amount of sag is a value in ZDD expressed by second order differential of a displacement of a surface of the wafer with respect to a radius of the wafer.

11. The method for manufacturing a bonded wafer according to claim 3, wherein the amount of sag is a value in ZDD expressed by second order differential of a displacement of a surface of the wafer with respect to a radius of the wafer.

12. The method for manufacturing a bonded wafer according to claim 4, wherein the amount of sag is a value in ZDD expressed by second order differential of a displacement of a surface of the wafer with respect to a radius of the wafer.

13. The method for manufacturing a bonded wafer according to claim 5, wherein the amount of sag is a value in ZDD expressed by second order differential of a displacement of a surface of the wafer with respect to a radius of the wafer.

14. The method for manufacturing a bonded wafer according to claim 6, wherein the amount of sag is a value in ZDD expressed by second order differential of a displacement of a surface of the wafer with respect to a radius of the wafer.

15. The method for manufacturing a bonded wafer according to claim 7, wherein the amount of sag is a value in ZDD expressed by second order differential of a displacement of a surface of the wafer with respect to a radius of the wafer.

16. The method for manufacturing a bonded wafer according to claim 8, wherein the amount of sag is a value in ZDD expressed by second order differential of a displacement of a surface of the wafer with respect to a radius of the wafer.

* * * * *